United States Patent [19]

Jordan et al.

[11] 4,313,022

[45] Jan. 26, 1982

[54] SOLAR CELL ARRAY

[75] Inventors: John F. Jordan; Curtis M. Lampkin, both of El Paso, Tex.

[73] Assignee: Photon Power, Inc., El Paso, Tex.

[21] Appl. No.: 189,131

[22] Filed: Sep. 22, 1980

Related U.S. Application Data

[60] Continuation-in-part of Ser. No. 945,312, Sep. 25, 1978, Pat. No. 4,243,432, which is a division of Ser. No. 831,544, Sep. 8, 1977, abandoned.

[51] Int. Cl.$^3$ .................... H01L 31/06; H01L 31/18
[52] U.S. Cl. ...................................... 136/244; 29/572
[58] Field of Search ................... 136/244, 249, 260; 29/572; 357/30; 427/74

[56] References Cited

U.S. PATENT DOCUMENTS

| | | | |
|---|---|---|---|
| 3,075,860 | 1/1963 | Veres | 117/211 |
| 3,104,188 | 9/1963 | Moncrief et al. | 136/249 |
| 3,151,379 | 10/1964 | Escoffery | 29/572 |
| 3,483,038 | 12/1969 | Hui et al. | 136/89 |
| 3,571,915 | 3/1971 | Shirland | 29/572 |
| 3,713,893 | 1/1973 | Shirland | 136/89 |
| 3,880,633 | 4/1975 | Jordan et al. | 65/60 |
| 3,902,920 | 9/1975 | Jordan et al. | 136/89 |
| 3,971,672 | 7/1976 | Lampkin | 136/89 |
| 3,977,904 | 8/1976 | Köhler | 136/246 |
| 4,042,418 | 8/1977 | Biter | 136/89 P |
| 4,078,963 | 3/1978 | Symersky | 156/652 |
| 4,159,914 | 7/1979 | Jordan et al. | 136/89 |
| 4,224,355 | 9/1980 | Lampkin et al. | 427/8 |
| 4,243,432 | 1/1981 | Jordan et al. | 136/244 |
| 4,245,386 | 1/1981 | Kausche et al. | 29/572 |

FOREIGN PATENT DOCUMENTS

| | | | |
|---|---|---|---|
| 1564935 | 6/1970 | Fed. Rep. of Germany | 136/89 P |
| 1037466 | 9/1953 | France | 136/89 P |

OTHER PUBLICATIONS

"Materials for Low Cost Solar Cells", by Shirland and Rai-Choudhury, published in Reports on Progress in Physics, vol. 41, 1978, pp. 1868–1870.

Primary Examiner—Aaron Weisstuch
Attorney, Agent, or Firm—Bard, Groves, Sroufe, Ryerson & Jackson

[57] ABSTRACT

An array of photovoltaic cells in a back wall-type configuration supported by a rigid transparent vitreous substrate, such as glass, for admitting incident radiation to the cells. A plurality of cells are interconnected into a desired electrical configuration by one or more layers of electrically conducting materials which overlie the entire heterojunction of each cell to minimize the internal resistance of the cell and may conveniently protect the heterojunction from degrading environmental conditions. Various component layers forming the photovoltaic cells are selectively removed and strips of insulating material are applied prior to forming the heterojunction. The electrically conductive material is thereafter applied and separated at areas protected by insulating material. The resulting series array contains no exposed heterojunction areas, thereby obtaining improved operating stability and performance.

10 Claims, 3 Drawing Figures

SOLAR CELL ARRAY

RELATED CASES

This case is a continuation-in-part from U.S. patent application Ser. No. 945,312 filed Sept. 25, 1978, now U.S. Pat. No. 4,243,432, which in turn is a divisional application from U.S. patent application Ser. No. 831,544 filed Sept. 8, 1977, and now abandoned.

FIELD OF THE INVENTION

This invention relates generally to large area photovoltaic cells which can be produced and interconnected for large scale terrestrial use and, more particularly, to a photovoltaic panel which is formed using mass production techniques, such as spray application of layers, and thereafter formed into an array of series connected solar cells and wherein the individual cells are formed by film removal apparatus.

BACKGROUND OF THE INVENTION

The search for alternate energy sources in the United States and throughout the world is progressing at an ever increasing rate as the available supplies of energy are being consumed. There are many alternate sources of energy which might be tapped but for technological and/or cost considerations. Solar energy is one source which is being extensively examined due to its abundance and to an apparent absence of environmentally deleterious side effects.

The technology and theory for producing basic photovoltaic cells which generate electrical energy in response to solar input is generally well known. The main technical problems which are currently under investigation deal with reducing this basic technology to a practice which is applicable to the production of such photovoltaic cells at a cost which is competitive with that required to construct and operate present day power generating facilities utilizing such energy sources as oil, coal, or nuclear fission. To accomplish this goal, it is apparent that electrical generating stations utilizing photovoltaic cells must be fabricated using mass production techniques wherein large areas, measured in terms of square miles, can be literally covered with such mass-produced photovoltaic cells. In accordance with the present invention, large area photovoltaic panels will be formed using production-type techniques and will thereafter be formed into an array of series connected photovoltaic cells in a process suited to mass production and sized to generate commercial quantities of electrical energy.

One technique for producing photovoltaic cells with polycrystalline CdS is to spray suitable solutions onto a substrate where the solution reacts to form a film of the desired material. U.S. Pat. No. 3,880,633 and No. 3,902,920 to Jordan et al disclose suitable techniques for forming large area back-wall type photovoltaic cells by the spray method. A glass substrate is moved through a series of spray booths to form layered films of tin oxide, cadmium sulfide, and perhaps cuprous sulfide. It is a feature of these spray processes that each film is formed at a temperature lower than that at which the preceding film is formed. Accordingly, it would be desirable to form the large photovoltaic panel into some number of smaller cells, to be connected in series for increased voltage outputs, only after all of the layers have been formed which require heat input to drive the reaction forming the layer. Such a technique would minimize the thermal cycling of the glass and the energy required to produce the photovoltaic panel.

U.S. patent application Ser. No. 831,544, a related case whose disclosure is hereby incorporated herein by reference, fully discusses various prior art techniques for interconnecting pluralities of photovoltaic cells whereby useful quantities of electrical energy can be made available. The subject application further discloses a backwall array of series connected photovoltaic cells having substantially continuous electrode areas for collecting electrical currents generated by the cells and having adjacent extending surface areas forming the desired interconnections.

A particular embodiment of the backwall array is formed to include a transparent vitreous substrate receiving incident radiation; a transparent conductive layer, which may be tin oxide ($SnO_x$): a semiconductor layer, which may be cadmium sulfide (CdS); a heterojunction, which may be copper sulfide ($Cu_xS$), forming a barrier layer; and one or more layers of an upper conductor material, such as metallic copper coated with a protective layer of lead. Separation of the upper conductor to obtain the series connection is obtained by removing a strippable material deposited prior to depositing the conductive materials.

It has been found, however, that the adherence between the tin oxide layer and the copper layer provides only a low resistance to forces tending to separate the two layers. Further, the copper sulfide forming the heterojunction is exposed once the strippable material is removed. In some instances, the electrical field adjacent the exposed copper sulfide can act to convert the copper sulfide to metallic copper which lowers the shunt resistance between cells, thereby reducing the overall conversion efficiency of the array. Yet another possible degradation can occur when the $Cu_xS$ layer is formed prior to component layer removal for cell separation. In this instance, the $Cu_xS$ layer may be exposed to the atmosphere for a time sufficient to form copper oxide in amounts effective to degrade overall cell, and hence array, performance.

The disadvantages of the prior art are overcome by the present invention, however, and improved methods are provided for obtaining an array of photovoltaic cells connected in series. Further, an improved array of series connected photovoltaic cells on a common substrate is provided.

SUMMARY OF THE INVENTION

A method is provided for forming a large area photovoltaic cell into a plurality of discrete photovoltaic cells on a common substrate. A large filmed area is first produced by forming layered films over substantially an entire surface of a transparent substrate. Portions of the films are thereafter selectively removed and only after film removal is a heterojunction formed to obtain a plurality of smaller photovoltaic cells. Finally, an overlying conducting material is applied to interconnect the photovoltaic cells into an array wherein the heterojunction is buried by the overlying conductive layer.

A further improved array of photovoltaic cells is provided wherein layered films form the composite photovoltaic heterojunction structure and attached electrodes. Substantially the entire surface area of a substrate is covered with each film and only those portions of each layer are removed which must be removed to form a plurality of photovoltaic cells on the substrate and to form the series electrical interconnections between the cells. The conducting material contacting and burying the heterojunction seals and protects the underlying materials while interconnecting the photovoltaic cells into a suitable array.

It is a feature of the present invention to form the panel array wherein each heterojunction-forming area is buried under an equipotential surface.

It is a feature of the present invention to provide a photovoltaic cell array in which all the photovoltaic cells are formed on a glass substrate which provides the illuminated surface.

It is a feature of the present invention that a photovoltaic array is provided in which the film area which must be removed to form and interconnect the plurality of photovoltaic cells, and not therefore available as an active power generating area, is greatly reduced.

It is a feature of the present invention to use a strippable material to separate the conductive layer and form the series connection.

It is another feature of the present invention to locate the strippable material to a location effective to minimize forces tending to separate the electrode layers at the areas of interconnection.

It is yet another feature to form the series-connected array by depositing the strippable material on the semiconductor prior to forming a heterojunction thereon.

It is a feature of the present invention that the conducting electrode material contacting the materials forming the heterojunction serves to wholly bury the heterojunction.

Other and further objects, advantages and features will become apparent from the following detailed description, wherein reference is made to the figures in the accompanying drawings.

DETAILED DESCRIPTION

Figure 1:
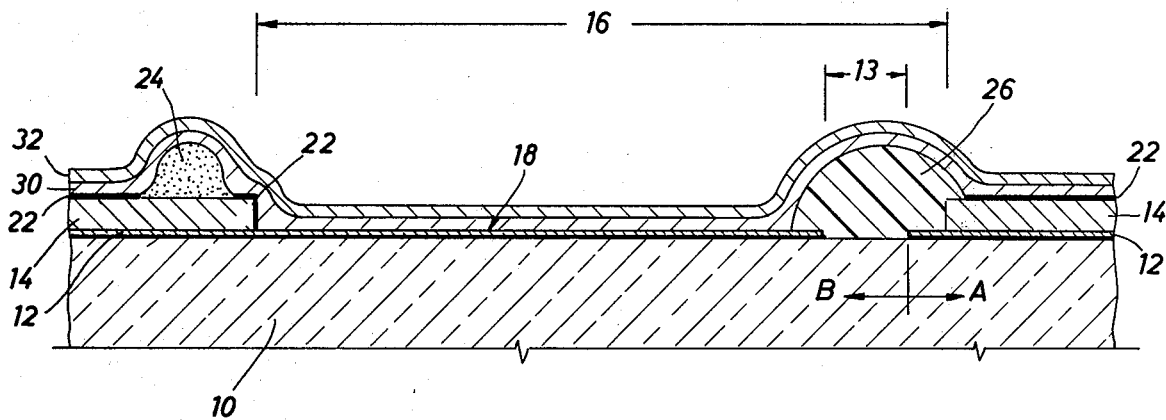
FIG. 1 is a cross section of a portion of a photovoltaic panel in which the basic photovoltaic layers have been applied and prior to electrode separation.

Referring now to FIG. 1, there may be seen a completed panel just prior to the separation of conductor layers 30 and 32 to form the desired electrical connection. The various component layers include a transparent vitreous substrate 10, a transparent conductive layer 12, a semiconductor material 14, a material 22 forming a heterojunction with semiconductor 10, a strippable material 24, a permanent insulation material 26, and conductive layers 30 and 32. Each of these components is more particularly described below. FIG. 1 depicts two adjacent photovoltaic cells A and B, as hereinafter discussed.

Transparent conductive layer 12 and semiconductor layer 14 are preferably tin oxide ($SnO_x$) and cadmium sulfide (CdS) formed on transparent vitreous substrate 10 using spray techniques and high temperature film formation. Although a spray process is not required for the subject invention, the films obtained therefrom are quite suitable for the various processes hereinafter discussed. Suitable film formation processes may be found in U.S. Pat. Nos. 3,902,920, 3,880,633, 4,159,154 and No. 4,224,355, all disclosures of which are incorporated herein by reference. Thus, $SnO_x$ layer 12 and CdS layer 14 are preferably formed in a single continuous process where an entire substrate panel 10 is filmed.

$SnO_x$ film 12 is removed along an area 13 effective to electrically isolate conductive layer 12 in photovoltaic cell A from the adjacent facing conductive layer 12 in photovoltaic cell B. The $SnO_x$ film 12 is a hard, tightly adherent film and cannot be readily removed by mechanical processes. Accordingly, a process may be chosen which essentially vaporizes a small portion of film 12 so that each photovoltaic unit is electrically isolated at this stage from adjacent photovoltaic units. One technique for vaporizing $SnO_x$ film 12 to form gap 13 is by means of a low voltage probe, typically at about 20 volts d.c., which creates an electrical arc to vaporize $SnO_x$ film 12 to be removed. However, the arc may be highly variable as a function of power supply fluctuations, arc gap variations over film 12, and other variables, and may not provide complete removal of $SnO_x$ film 12 from gap 13. In addition, an arc can produce heating of the CdS layer 14 sufficient to degrade portions of the CdS adjacent the arc.

A preferred process for removing $SnO_x$ layer 12 is to use a highly focused laser, such as a neodium YAG laser. A relatively low power output can be used to completely remove a line of $SnO_x$ 12 to form gap 13 with substantially improved resolution over arcing techniques. In addition, $SnO_x$ layer 12 can be removed with its overlying CdS since the electrical current flow of the arc is no longer required. The focused power input provides little or no damage to adjacent areas of CdS 14 remaining after interconnection area 16 is formed as hereinafter discussed. The width of isolation gap 13 is preferably only that width needed to assure isolation between adjacent cell areas A and B. Gap 13 widths in the order of 100 microns have been obtained.

Strips 16 of CdS layer 14 may be removed to complete the separation of cell areas A and B, exposing surface 18 of $SnO_x$ layer 12. Strip 16 is preferably one millimeter or less in width and only that width required for depositing the insulating strips and for forming the electrical contact with an adjacent extending upper electrode, as hereinafter explained. Since $SnO_x$ layer 12 is much harder than semiconductor film 14, a cutting tool may be used to form strip 16 by scraping away portions of film 14.

Once cell areas A and B have been formed and electrically isolated, one from the other, the units are then prepared to receive the overlying layers of conducting materials which are to be applied. A first strip of material 24 is formed on semiconductor layer 14 adjacent exposed area 18 of $SnO_x$ 12. It is preferred that material strip 24 not overlap onto exposed $SnO_x$ area 18, for reasons hereinafter explained. A second strip of insulating material 26 is formed over the exposed edges of the semiconducting layers of cell area B and to completely bridge gap 13.

Material strips 24 and 26 may be formed from a variety of materials which do not produce degradation of the semiconducting properties of the materials. The material forming strip 26 preferably has thermal contraction and expansion characteristics compatible with the overlying conductive layers 30 and 32 to minimize cracking of these layers. Materials which have been successfully used include a photo-resist marketed under the trademark KMER by Kodak, polyvinyl chloride films, acrylic paint, and cellulose film formers.

In a preferred embodiment, material strip 24 cures to form a strippable material for separating the overlying layers. In this case, material 24 may be formed from asphalt based printing inks or solvent based strippable film forming materials, which are well known in the printing industry and the etching industry. The method of applying these material strips is conventional, using a needle-like pen having a fairly large aperture such that the insulating material may be applied as a high solid content slurry with just enough solvent to enable the slurry to flow through the pen.

After the above steps have been completed, the heterojunction is then formed with semiconductor layers 14 on the panel. When CdS forms semiconductor layer 14, a copper sulfide ($Cu_xS$) is a preferred material for layer 22 and the $Cu_xS$ may be formed by any conventional process, such as ion exchange by dipping the prepared panel in a solution of copper ions. The heterojunction-forming layer 22 is formed over all of the CdS layer 14 not protected by material strips 24 and 26. The exposed $SnO_x$ surface 18 is not affected by the ion exchange process. Thus, a plurality of unconnected photovoltaic cells have been formed on the surface of substrate 10.

Referring again to FIG. 1 there may be seen a panel with the overlying conductor layers 30 and 32 formed over the surface of photovoltaic cell areas A and B. It is preferred to cover the entire substrate area with conductive materials and this may conveniently be accomplished by vacuum-evaporating one or more conductive materials over the surface. As shown in FIG. 1, a first conductor layer 30 is vacuum-evaporated over the entire area of the substrate and layer 30 may conveniently be copper which forms a satisfactory bond with the $Cu_xS$ layer 22. Electrical and mechanical contact is also obtained between conductor 30 and $SnO_x$ layer 12 in exposed area 18.

Finally, a layer of lead 32 may be applied over the layer of copper 30 to further provide a conductive path for the electrical current and to protect copper layer 30 from oxidation and other damage during subsequent fabrication of the cells into photovoltaic structures suitable for installation in a large scale array. It should be noted, however, that copper and lead tend to form an alloy at the junction of the two metals if the cell is heated subsequent to forming both layers. Thus, a very thin barrier film may be required at the junction to prevent direct contact between the lead and copper. A suitable physical barrier may be formed from oxidized copper, iron, chrome, or inconel.

In one aspect of the present invention the layer of lead serves to protect the $Cu_xS$ layer from degradation and prolong the life of the photovoltaic heterojunction. Normally, cuprous sulfide is quite susceptible to degradation in the presence of oxygen and water, such as would occur if the layer were exposed to the atmosphere for front wall-type operation. Transparent conductors have not been available to cover the cuprous sulfide layer and protect the layer. Thus, grid-like electrode configurations have been required with a further covering needed to seal the cell. The back wall-type photovoltaic cell which is the subject of the present invention does not require direct illumination through the cuprous sulfide layer so a solid electrode may be used which may also seal and protect the cuprous sulfide layer.

It has been found that multi-layer conductors of copper and lead provide many advantages. The copper adheres well to the cuprous sulfide and also helps to maintain the stoichiometry of the cuprous sulfide. However, copper alone is somewhat permeable to oxygen and water vapor. A second layer formed of lead over the copper then seals the copper. Lead is also a conductor and thus serves to improve the overall conductivity of the overlying conducting material while protecting the $Cu_xS$.

Figure 2:
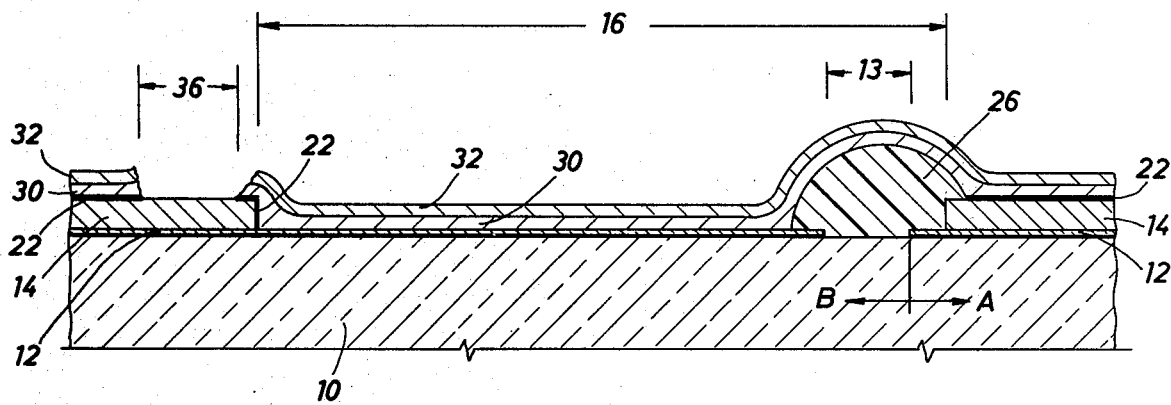
FIG. 2 is a cross-sectional view of a portion of a photovoltaic panel on which the basic photovoltaic layers have been applied and subsequent to electrode separation.

Referring now to FIG. 2 there may be seen a cross-sectional view of a completed panel of photovoltaic cells which are connected in series. A portion of overlying electrical conducting layers 30 and 32 forms an electrical contact with a portion of the exposed $SnO_x$ area 18 of photovoltaic cell B. Conducting layers 30 and 32 then extend over the $Cu_xS$ layer 22 of the adjacent photovoltaic cell A and are insulated from contact with any other portion of the adjacent photovoltaic cell by insulation 26. Since the $SnO_x$ layer 12 is the negative electrode of photovoltaic unit B and the $Cu_xS$ layer 22 forms the positive portion of adjacent unit A, the photovoltaic units are thereby connected electrically in a series arrangement. If desired, the layered surface of the photovoltaic panel may then be covered with a suitable sealant (not shown) for protection against exposure to detrimental environmental conditions.

It is, of course, necessary to separate conductors 30 and 32 at selected locations to complete a series interconnection. In a preferred embodiment, this is done by pulling up strippable material 24, causing portions of conductive layers 30 and 32 to be removed to form separation 36. Strippable material 24 should be removed with some care to prevent separating conductive layers 30 and 32 in region 16 from bottom conductor 12 to prevent "peeling." In one configuration, strippable material 24 is located entirely on the semiconductor layer 14 to reduce the forces tending to peel upper conductors 30 and 32 from lower conductor 12, thereby maintaining the mechanical and electrical bond between the layers and keeping the series resistance at a low value.

It will be appreciated that none of the $Cu_xS$ 22 is exposed within series separation 36. During operation of the photovoltaic panel an electrical potential difference exists across separation 36. When $Cu_xS$ layer 22 is formed prior to separating layers 12 and 14, $Cu_xS$ exists in separation 36. The electrical potential can act to reduce $Cu_xS$ to form metallic copper, producing electrical short circuits across separation 36 and degrading overall panel performance. The early formation of the $Cu_xS$ layer also exposes the $Cu_xS$ to the atmosphere for a longer period of time, wherein oxidation and other atmospheric degradations can affect the $Cu_xS$.

Thus, the present improvements act to minimize degradation mechanisms which affect panel performance and lifetime. No $Cu_xS$ exists to connect areas of different electrical potentials, all of the $Cu_xS$ 22 being buried by electrode layers 30 and 32. Each separate area containing electrode layers 30 and 32 defines substantially an equipotential surface, with a potential difference between adjacent electrode layers equal to the voltage output of the cell at the cell operating point. Each area of $Cu_xS$ is buried beneath an equipotential area and there is no $Cu_xS$ exposed between areas having different equipotential levels. Also, the overlying electrode layers 30 and 32 are applied within a short time interval after $Cu_xS$ 22 is formed, particularly compared with forming $Cu_xS$ 22 prior to forming gaps 13 and 16.

It will be appreciated from the above discussion that the entire operation for forming the series connected photovoltaic units is one which is well adapted to a mass production process. The steps of forming the individual cell units A and B and applying the insulating and strippable materials 26 and 24 may all be done by a suitable machine making a single pass across the surface of the coated substrate. If desired a plurality of devices may be used so that the entire panel is prepared at one time and the panel need be accurately positioned only a few times. The subsequent step of forming the metallic conducting layers 30 and 32 by vacuum evaporation can be readily accomplished on a production basis. As discussed in U.S. Pat. No. 4,243,432, a variety of techniques are available for selectively removing portions of the overlying conductor films 30 and 32 to form the completed array in addition to using a strippable resist.

Figure 3:
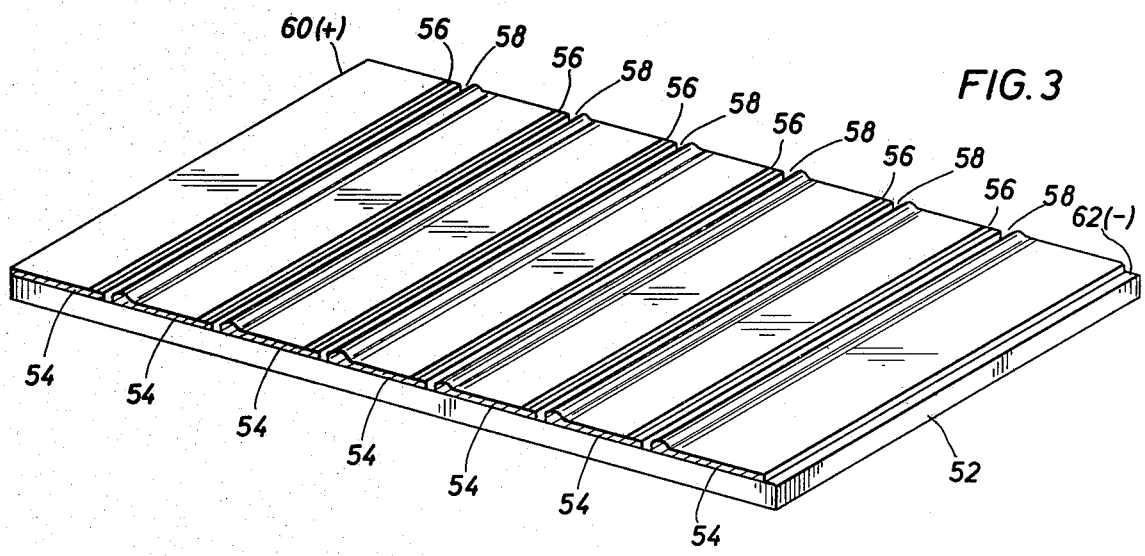
FIG. 3 is an isometric view of a completed photovoltaic panel formed according to the present invention (depth of the photovoltaic layers is exaggerated).

In a preferred embodiment shown in FIG. 3, a completed panel includes a transparent vitreous substrate 52 such as glass and photovoltaic cells 54 arranged on the glass in a back-wall configuration, i.e., with the CdS nearest the glass. The arrangement is particularly suitable for filming the initial large area substrate 52 by spray techniques. Each of the films of the glass substrate is formed successively and at progressively lower temperatures. Thus, films once formed are not subject to possibly damaging temperatures. Further, glass is heat-resistant and can withstand the relatively high temperatures to produce the tin oxide and cadmium sulfide films.

A glass substrate is also particularly suited for forming the large area photovoltaic cells into smaller cells. The rigid support provided for the overlying films allows a cutting tool to be used for film removal. The heat resistance of the glass also permits the tin oxide to be removed by vaporization, including a laser, wherein the integrity of the substrate is maintained.

It is now apparent that the photovoltaic panel, hereinabove described, is one well suited to providing a low cost photovoltaic cell suitable for large scale production of electrical power. Each photovoltaic panel covers a large area and is capable of handling such amounts of current whereby large quantities of power may be obtained at relatively low DC voltages of 18-24 volts. The internal resistance of the photovoltaic units is minimized by forming the $SnO_x$ layer in accordance with U.S. patents and patent applications, hereinabove referenced, wherein a process for forming a very low resistance $SnO_x$ film is disclosed. A desirable tin oxide layer has a sheet resistivity of about 5 to 10 ohms per square. This sheet resistivity allows a cell width of up to about two centimeters without producing unacceptable internal power losses within each cell.

Other advantages of the solar cell array according to the present invention include forming the large area photovoltaic cells in mass production, where spraying techniques are used to produce the plurality of layers forming the photovoltaic cells over the supporting substrate. Further, the active area of the entire photovoltaic panel is maximized since the inactive areas required for series electrode connection 58 and separation 56 generally form less than about ten percent of the entire panel area, and the overlying conductors are formed as substantially continuous layers whereby a low resistance is obtained. Finally, the glass substrate inherently seals the radiation incident surface without restricting light admittance and the generally conterminous conductors seal the heterojunction surfaces to produce a panel which is substantially protected from atmospheric effects. It is expected that some final packaging may provide a final sealant for the exposed edges of the photovoltaic cells and a backing for physical protection, but no special packaging and sealing is otherwise required.

While the final means for supporting and interconnecting photovoltaic panel 52 into an overall network for generating commercial quantities of electrical energy is not the subject to which the present invention is directed, it should be noted that many suitable materials for forming terminals 60 and 62 exist. The only requirement is that positive terminal 60 be formed in contact with a $Cu_xS$ layer and that negative terminal 62 be formed in contact with a $SnO_x$ layer and insulated from contact with film layers overlying the $SnO_x$.

It is therefore apparent that the present invention is one well adapted to attain all of the objects and advantages hereinabove set forth together with other advantages which will become obvious and inherent from a description of the process and products themselves. It will be understood that certain combinations and sub-combinations are of utility and may be obtained without reference to other features and subcombinations. This is contemplated by and is within the scope of the present invention.

As many possible embodiments may be made of this invention without departing from the spirit or scope thereof, it is to be understood that all matters herein set forth in the accompanying drawings are to be interpreted as illustrative and not in any limiting sense.

What is claimed is:

1. A process for forming a series-connected backwall array of photovoltaic cells on a common transparent vitreous substrate, wherein the photovoltaic cell component layers include a transparent electrically conductive layer adjacent said substrate, a semiconductor layer adjacent said transparent conductive layer, a material forming a heterojunction with the semiconductor material, and an upper conductive layer contacting said heterojunction-forming material and wherein said transparent conductive layer and said semiconductor layer are initially formed as substantially continuous layers over said substrate, the process improvement comprising the steps of:

selectively removing portions of said transparent conductive layer and said semiconductor layer to form a plurality of paired adjacent cell areas including an interconnection region associated with and between each said pair of adjacent cell areas, said interconnection region defining an isolation gap where said transparent conductive layer and said semiconductor layer are removed and an electrode connection area where said semiconductor layer is removed from a portion of one said pairs of adjacent cell areas to expose said transparent conductive layer adjacent said isolation gap;

depositing an insulating material filling said isolation gap and extending to said semiconductor layer of the other of said pairs of cell areas;

depositing a strippable material onto said semiconductor layer of each said cell area adjacent its associated electrode connection area;

thereafter forming a heterojunction on exposed areas of said semiconductor layer;

depositing a substantially continuous upper electrically conductive layer over said plurality of cell areas and in physical and electrical contact with said exposed transparent conductive layer; and thereafter removing said strippable material to segment said upper conductive layer for obtaining said series-connected array.

2. A process according to claim 1, wherein depositing said strippable material includes the step of:

placing said strippable material on each said cell area at a location effective to reduce forces tending to separate said upper electrode from said transparent electrode in said connection area.

3. A process according to claim 1 or 2, including the step of:

locating said strippable material wholly on portions of said semiconductor material.

4. A process improvement in forming a series interconnection between adjacent photovoltaic cells, said cells having a heterojunction-type barrier layer and a common substrate, by removing a strippable material to segment an upper electrode layer at selected locations, wherein the process improvement comprises the step of:

depositing said strippable material prior to forming said heterojunction.

5. A process improvement in forming a series interconnection between adjacent photovoltaic cells, said cells having a heterojunction-type barrier layer and a common substrate, by removing a strippable material to segment an upper electrode layer at selected locations, wherein the process improvement comprises the step of: burying each of said heterojunctions beneath a substantially equipotential electrode area.

6. A series-connected backwall array of photovoltaic cells on a common transparent vitreous substrate, wherein the photovoltaic cell component layers include a transparent electrically conductive layer adjacent said substrate, a semiconductor layer adjacent said transparent conductive layer, a material forming a heterojunction with the semiconductor material, and an upper electrode structure having a first portion defining a continuous surface over a heterojunction area on one cell and a second portion extending to physical and electrical contact with said transparent conductive layer of an adjacent cell, wherein the improvement comprises:

an edge of said second electrode portion of one said photovoltaic cell being in facing relationship with an edge of said first upper electrode portion of an adjacent photovoltaic cell, said edges defining a separation zone on said semiconductor layer substantialy free of said heterojunction.

7. Apparatus according to claim 6, wherein said semiconductor layer includes CdS.

8. Apparatus according to claim 6 or 7, wherein said heterojunction-forming material is $Cu_xS$.

9. Apparatus according to claim 8, wherein said upper electrode structure includes a layer of metallic copper.

10. Apparatus according to claim 9, wherein said transparent conductive layer is $SnO_x$.

* * * * *